(12) United States Patent
Henry et al.

(10) Patent No.: US 7,294,445 B2
(45) Date of Patent: Nov. 13, 2007

(54) METHOD FOR SIMULATING SPOT VARNISH ON A SURPRINT PROOF

(75) Inventors: Eileen T. Henry, Rochester, NY (US); Calvin D. Curtice, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 11/240,721

(22) Filed: Sep. 30, 2005

(65) Prior Publication Data

US 2006/0073426 A1 Apr. 6, 2006

Related U.S. Application Data

(60) Provisional application No. 60/615,654, filed on Oct. 3, 2004.

(51) Int. Cl.
 G03C 11/12 (2006.01)
 G03C 7/00 (2006.01)
 G03F 7/34 (2006.01)
(52) U.S. Cl. ............... 430/201; 430/200; 430/257; 430/293; 430/950; 430/952
(58) Field of Classification Search ........... 430/200, 430/201, 257, 293, 950, 952
 See application file for complete search history.

(56) References Cited

U.S. PATENT DOCUMENTS

| 4,376,159 | A | | 3/1983 | Spechler |
| 4,710,447 | A | | 12/1987 | Kreiter |
| 5,126,760 | A | | 6/1992 | DeBoer |
| 5,633,117 | A | * | 5/1997 | Barjesteh et al. ........... 430/256 |
| 5,845,575 | A | | 12/1998 | Eda et al. |
| 6,060,210 | A | | 5/2000 | Eda et al. |
| 6,190,827 | B1 | * | 2/2001 | Weidner ..................... 430/201 |
| 6,593,060 | B2 | * | 7/2003 | Konuma ................... 430/271.1 |
| 6,899,988 | B2 | * | 5/2005 | Kidnie et al. ............... 430/200 |
| 7,229,726 | B2 | * | 6/2007 | Caspar ........................ 430/7 |
| 2001/0004485 | A1 | * | 6/2001 | Takahashi et al. .......... 428/195 |

FOREIGN PATENT DOCUMENTS

| EP | 1 522 407 A1 | 4/2005 |
| GB | 1147479 | 4/1969 |

OTHER PUBLICATIONS

Marie-Claude Beland and Jean M. Bennett, "Effect of Local Microroughness on the Gloss Uniformity of Printed Paper Surfaces", Jun. 1, 2000/vol. 39, No. 16/Applied Optics, pp. 2719-2726.

* cited by examiner

*Primary Examiner*—Richard L. Schilling
(74) *Attorney, Agent, or Firm*—Kathleen Neuner Manne; Lynne M. Blank

(57) ABSTRACT

A method of forming a glossy area on a pre-press proof is provided, wherein the method includes printing a spot varnish layer, wherein the presence of the spot varnish enhances the glossiness of the overprinted color layers of the image. The method provides a pre-press proof simulating a printed spot varnish.

40 Claims, No Drawings

METHOD FOR SIMULATING SPOT VARNISH ON A SURPRINT PROOF

CROSS-REFERENCE TO RELATED APPLICATIONS

This is a 111A application of Provisional Application Ser. No. 60/615,654, filed Oct. 3, 2004.

TECHNICAL FIELD

The present invention relates to methods for making an integral color proof including a proof image having at least one selected area that simulates a spot-varnish finish. In other words, the selected area of the proof image will have a higher gloss level than other areas of the proof image. The present invention has particular utility in thermal transfer imaging using an infrared radiation source.

BACKGROUND OF THE INVENTION

There is great interest in the generation of images using thermal transfer technology, particularly in the generation of images using near-infrared laser devices. In thermal transfer imaging, an image is formed by transfer of a colorant (e.g., a dye or pigment) from a donor layer of a donor element to an image-receiving layer of an image-receiving element under the influence of energy from a thermal resistive printhead or a laser. The donor element, which is generally a sheet having a coating layer containing a transferable colorant, and an image-receiving layer of an image-receiving element are brought either into close proximity or into contact with each other to form a donor-receiver assembly. Energy is applied to a side of the donor element opposite the donor layer to transfer an image from the donor to the receiver. When the energy source is a laser, an infrared absorber can be present in one or both of the donor element and image-receiving element. Most commonly, the infrared absorber is present only in the donor element. When the donor-receiver assembly is patternwise exposed to infrared radiation, for example from a scanning infrared laser source, the radiation can be absorbed by the infrared absorber and converted to heat, which causes transfer of colorant from the donor layer of the donor element to the image-receiving layer of the image-receiving element in the imaged areas. The resulting image can be monochrome, or by repeating the process with donors of various colors, a multi-colored image can be produced on a common image-receiving element. Such a process is useful for generating color proofs, for instance.

Thermal transfer imaging may be utilized in the production of color proofs. Pre-press or off-press color proofing is used by printers to simulate the images that will be produced by a printing process. Pre-press color proofing systems include overlay proofing systems and integral proofing systems.

In an overlay proof, each printing color is generally segregated onto a separate transparent sheet or film, known as an overlay. The individual overlays are assembled in registration to make the overlay proof, which is viewed as a composite against an appropriate background (e.g., an opaque reflective white sheet), to predict the appearance of a printed image.

In an integral proof, all printing colors are generally transferred to one medium. One commonly used method of obtaining an integral proof is by a "surprint" technique. In a surprint technique, the transfer process described above is repeated using different donor elements, generally representing different colors, and the same image-receiving element. In this manner, several monochrome images are superimposed in register on a common receiver element, thereby generating a multi-color image in a single-sheet format. A proof made by the surprint technique is also known as an "overprint" proof, and the two terms are used interchangeably herein.

Both overlay proofs and surprint proofs are commonly used as "contract proofs." A contract proof serves as a promise by the printer to a customer that a proofed image will be duplicated by the printing process when press prints are made. Therefore, the printer desires to have proofs that can most accurately predict the image that will be reproduced on press. It is desired that the color proof will accurately represent the image quality, details, color tone scale and, in many cases, the halftone pattern of the prints obtained on the printing press. A proof is also useful for checking the accuracy of the color separation data from which the final printing plates or cylinders are made.

The surprint process is ideally suited for processing images by a thermal transfer imaging procedure using digitally stored information. The surprint process has the additional benefit of not requiring chemical processing and of not employing materials that are sensitive to ambient white light. The process is particularly suited to the color proofing industry, where color separation information is routinely generated and stored electronically, and the ability to convert such data into hardcopy via digital address of "dry" media is seen as an advantage.

In thermal transfer imaging, the transfer of colorant can occur via mass transfer or dye transfer. In a mass transfer system, the majority of the material on the donor element, for example, the colorant, binder, and any additives, is transferred to the image-receiving element. For a laser thermal transfer system, this occurs by ablation, where gases are generated by the laser in the donor to explosively propel the donor material to the receiver. In a dye transfer system, only the colorant is transferred from the donor element to the image-receiving element. That is, the colorant is transferred unaccompanied by the binder or other additives. Colorant transfer under influence of a laser is by dye sublimation.

Thermal transfer imaging systems produce excellent results with respect to approximating images that can be produced on-press using standard colors, such as the process colors cyan, magenta, yellow, and black, or even custom (e.g., PANTONE) colors. In addition to standard or custom colors, however, a press print will sometimes require the use of an image or finish that cannot be duplicated by merely adjusting light absorption properties of the printed image. For example, specialty finishes such as metallics, fluorescents, and pearlescents can be used on-press to create interesting visual effects. Such visual effects are often realized by the use of specialized pigments or coatings, and are not always easy to reproduce using a digital proof created from a thermal transfer imaging system.

One technique that is used on-press to create visual interest is the application of a spot varnish or gloss to selected portions of a printed image to enhance the glossiness of the selected portions. If the varnish is applied while the press ink is still wet, the technique is called "wet trap varnish." If the ink is allowed to dry first, the technique is called "dry trap varnish." Spot varnishing is often used in the production of high-quality prints.

However, methods for mimicking the on-press application of a spot varnish in a pre-press digital proof have not always proven to be straightforward. U.S. Pat. No. 6,060, 210 to Eda, et al. reports a varnishing film and a method of adjusting the surface gloss of a pre-press color proof using the varnishing film. The varnishing film comprises an adhesive transparent resin layer containing transparent matting agent and a transparent photosensitive layer provided on a transparent support. The method requires exposure and development of the photosensitive layer to form a special film resulting in a gloss finish on the surface of a proof. The photosensitive layer requires liquid development to form a gloss version of the image, complicating the proofing process.

Another method of representing a spot varnish is to produce a full-color surprint proof, and then use a transparent overlay that is colored only in the areas to which a spot varnish is to be applied, to represent the spot varnish.

Presently, it is not uncommon for a pre-press surprint proof to completely lack a surface finish that can predict the result that will be obtained on-press when a spot varnish is employed. There remains a need for a process by which an accurate proof that can emulate the appearance of a spot varnish applied on-press can be made in a simple fashion.

SUMMARY OF THE INVENTION

In one embodiment, the present invention provides a color proof having a selected area that simulates a spot-varnish finish. In other words, the selected area of the proof image will have a higher gloss level than other areas of the proof image. Methods of forming the color proof are provided.

The methods of the invention are particularly suitable for thermal transfer imaging systems that utilize a dye transfer mechanism, although the methods may be adapted for use with other systems such as mass-transfer systems that use transparent or opaque pigments as colorants, or with a system utilizing both dye and pigment transfer.

The invention utilizes a mass transfer mechanism to transfer a gloss-providing layer to an intermediate image-receiving element or a final image-receiving element, such as a proof substrate.

The invention provides a method for making a color proof having at least one selected image area with a spot-varnish finish, wherein the method comprises imagewise applying a spot-varnish to a proof substrate in the selected image area; and imagewise applying colorant to the spot-varnished proof substrate to form the color proof, whereby the at least one selected image area on the color proof has a higher gloss level than non-selected areas having no spot-varnish.

The invention further provides a method of forming a color proof comprising analyzing an image to create data representative of each image color and each image glossy area; transmitting the data to a proof printer; and imagewise printing each image color and a spot varnish corresponding to each glossy area to a receiving substrate with the proof printer.

ADVANTAGES

The methods of the invention, and resulting images, provide an accurate reproduction of a spot varnish press print in a pre-print digital proof. The methods require no additional steps, and no additional materials besides those already used in forming a digital proof, thereby reducing cost and time to produce a spot varnish over previously used methods. The spot varnish layer can be generated from the image data provided for forming the digital proof, requiring no further data manipulation or image templates.

DETAILED DESCRIPTION OF THE INVENTION

In thermal transfer imaging, the transfer of colorant (dye or pigment) can occur via mass transfer or dye transfer. In a mass transfer system, the majority of the material on the donor element, for example, colorant, binder, and additives, is transferred to the image-receiving element. Mass transfer can occur by an ablative mechanism, for example. In a dye, transfer system, only the colorant, in this case a dye, is transferred from the donor element to the image-receiving element. That is, the colorant is transferred unaccompanied by the binder or other additives, typically through sublimation.

In a mass transfer system employing an ablative mechanism, gases are typically generated that explosively propel material from the donor element across to the image-receiving element. For example, there may be a rapid build-up of pressure as a result of volatilization or decomposition of binders or other components of the donor layer or an adjacent layer to gaseous products, causing physical propulsion of colorant material from the donor element to the image-receiving element.

Ablation transfer is reported, for example, in U.S. Pat. No. 5,171,650 to Ellis, et al. and in International Publication WO 90/12342. U.S. Pat. No. 5,171,650 reports a laser thermal donor element that uses an ablation transfer mechanism to transfer a colorant to an image-receiving element. U.S. Pat. No. 5,278,023 to Bills, et al. reports a propellant-containing thermal transfer donor element that is used to mass transfer colorants to an image-receiving element.

The image formed from a mass transfer system is typically a halftone image. In a system that forms halftone images, the transfer forms a bi-level image in which either zero or a predetermined density level of colorant is transferred in the form of discrete dots (i.e., pixels). These dots can be randomly or regularly spaced per unit area, but are normally too small to be resolved by the naked eye. Thus, the perceived optical density in a halftone image is controlled by the size and the number of discrete dots per unit area. The smaller the fraction of a unit area covered by the dots, the less dense the image will appear to an observer.

In a dye transfer system, only the colorant is transferred from the donor element to the image-receiving element. That is, the colorant is transferred unaccompanied by the binder or other additives. This can occur either by a diffusion mechanism or a sublimation mechanism, for example. To effect dye transfer, energy can be provided in the form of heat from a resistive printhead, for example, resulting in diffusion, or energy can be provided in the form of a laser, resulting in dye sublimation from the donor element to the image-receiving element.

Diffusion or sublimation transfer enables the amount of colorant transferred to vary continuously with the input energy. The image formed from a dye transfer system can therefore be a continuous tone, or "contone," image. In a contone image, the perceived optical density is a function of the quantity of colorant per pixel, higher densities being obtained by transferring greater amounts of colorant.

To emulate halftone images using a colorant transfer system, which typically forms a contone image, the imaging laser beam can be modulated by electronic signals which are representative of the shape and color of the original image, so that each donor is heated to cause volatilization of the colorant only in those areas in which its presence is required on the image-receiving element to reconstruct the color and shape of the original image. Further details of this process are reported in GB 2083726, for example.

An example of a dye diffusion system is reported, for example, in U.S. Pat. No. 5,126,760 to DeBoer. In U.S. Pat. No. 5,126,760, a thermal dye transfer process is described for producing a direct digital, halftone color proof of an original image. The proof is used to represent a printed color image obtained from a printing press. The process described therein comprises: a) generating a set of electrical signals which is representative of the shape and color scale of an original image; b) superposing a dye donor element comprising a support having thereon a dye layer and an infrared-absorbing material with a first dye-receiving element comprising a support having thereon a polymeric, dye image-receiving layer; (c) using the signals to imagewise-heat by means of a diode laser the dye donor element, thereby transferring a dye image from the dye donor element to the first dye-receiving element; and d) retransferring the dye image to a second dye image-receiving element which has the same substrate as the press-printed color image. Although techniques for simulating an "overall" varnish or gloss have been employed, digital proofing systems have been largely without adequate methods to simulate a spot varnish in an integral proof. The methods known for producing a varnish, as discussed earlier herein, do not result in an image approximating that of a press print, having instead colored spots representing varnished areas, or require additional steps, adding time and cost to digital proofing.

As used herein, the phrase "spot varnish" refers to the selective application of a varnish, UV ink, or other gloss-enhancing finish or coating to only selected areas of a press-printed image or proof for the purposes of enhancing the gloss level or luster of the selected areas. A spot varnish is typically applied to highlight selected areas of an image relative to the unvarnished areas. For press-prints, a spot varnish can be applied in-line on the press, or post-press. After application of a spot varnish, the selected image areas have a higher gloss level than unvarnished image areas, and generally a higher gloss level than unimaged areas of the print medium. Methods of spot varnishing proofs in-line during digital proofing are provided herein.

The term "gloss" generally refers to the angular selectivity or dependence of reflectance of surface-reflected light. As used herein, the phrase "gloss level" is used for simplicity to refer to the specular reflectance of a surface. Surface reflections can be categorized as "diffuse" or "specular." Diffuse reflection is isotropic, meaning that light is reflected at all angles. Diffuse reflection often occurs from a roughened surface. Specular reflection is the anisotropic "mirror-like" reflection that occurs when an incident beam of light is reflected from a surface at an angle equal to the incident angle. "Specular reflectance" or "specular gloss" refers to a measure of relative luminous fractional reflectance from a surface in a specular direction. The magnitude of the specular reflectance depends on the angle of incidence, and on the difference in refractive indices between two media at an interface, for example, air and a substrate. Specular reflectance can be measured using a conventional gloss meter.

The application of a spot varnish to selected areas on a press print is not intended to produce a truly reflective, mirror-like surface that is capable of specularly reflecting an image. Rather, a spot varnish is generally effective to produce reflectance that is more strongly dependent upon viewing angle. Reflectance that depends strongly on viewing angle, but that is not truly specular, is sometimes called "directional diffuse" or "glossy" reflection. More accurately, the term "luster" should be used to refer to the characteristic of a surface that has a much higher reflectance at angles near the specular angle than isotropically, but does not have such a high specular reflectance as to form clear mirror images. However, the term "gloss" and the phrase "gloss level" are used herein in place of "luster" for simplicity.

In general, the selected areas of a press print that are treated with a spot varnish can be characterized by a 75 degree gloss level in the range from 10 to 90, for example, from 40 to 80, or from 60 to 80, when measured using a gloss meter according to standardized measuring procedures. The selected areas of the press print that are treated with a spot varnish will also be characterized by a 75 degree gloss level that is higher than the gloss level similarly measured for untreated areas. In general, the gloss level for varnished image areas will be at least 5 units higher than the gloss level for untreated areas, for example, 10 to 20 units higher, and often 30 units higher or more.

Likewise, with respect to the practice of the present invention, the selected areas of the proof image should not appear as a truly reflective surface that is capable of specularly reflecting an image. Rather, the selected areas should mimic the results that will be obtained on-press and should reproduce the luster or gloss of the spot-varnished areas of the press print as closely as possible.

Hence, the selected areas of the proof image will generally be characterized by a 75-degree gloss level in the range from 10 to 90, for example, in the range from 40 to 80, or from 60 to 80. The selected areas of the proof image will also be characterized by a 75-degree gloss level that is higher than the gloss level similarly measured for image areas that are not intended to represent areas of the press print that will receive spot varnish. In general, the gloss level for selected areas of the proof image will be at least 5 units higher than the gloss level for untreated areas, for example, 10 to 20 units higher, and often 30 units higher or more than the gloss level for other areas of the image.

To form an image, one or more donor elements are required. One donor element can be provided for each color to be represented in the final image, or fewer donor elements can be provided where colors in the final image can be made by additive color effect of other colors, for example, by use of cyan, magenta, and yellow. Each donor element can include a support and a colorant donor layer. The donor element can additionally include one or more of a barrier layer as described, for example, in U.S. Pat. Nos. 5,468,591 and 5,459,017; a propellant layer; a slip layer; a conductive layer as described, for example, in U.S. Pat. No. 6,423,464; an overcoat layer as described, for example, in U.S. Pat. Nos. 5,429,909, 6,218,071, and 6,423,464; an antistat layer as described, for example, in U.S. Pat. Nos. 5,468,591 and 5,459,017; a compliant or cushioning layer as described, for example, in U.S. Pat. No. 6,259,465; or other functional layers known in the art.

The colorant donor layer can include dyes, pigments, or a combination thereof. Suitable dyes or pigments can be chosen based on a target color to be matched, the process by which the image will be formed, for example, mass transfer or sublimation, stability of the colorant, or other known factors.

The donor element that is used in the process of the invention comprises a support having thereon a colorant-containing or colorant-donor layer. Any material can be used as the support for the donor element employed in the invention provided it is dimensionally stable and can withstand the energy, for example, heat, needed to transfer the colorant from the donor layer to an image-receiving layer on an image-receiving element. Such materials can include, for example, polyesters such as poly(ethylene terephthalate) or poly(ethylene naphthalate): polyamides; polycarbonates; cellulose esters such as cellulose acetate; fluorine polymers such as polyvinylidene fluoride or poly(tetrafluoroethylene-cohexafluoropropylene); polyethers such as polyoxymethylene; polyacetals; polyolefins such as polystyrene, polyethylene, polypropylene or methylpentane polymers; and polyimides such as polyimide-amides and polyetherimides. The support can be transparent. The support generally has a thickness of from 5 to 200 μm. The support can be coated on one or both sides with a subbing layer, an anti-static, a slip layer, any other layer used in the imaging arts, or a combination thereof.

The donor can include a hydrophilic layer, for example, gelatin, polyvinyl alcohol, polyvinyl acetate, methyl cellulose, hydroxypropyl methyl cellulose, polyvinylpyrrolidone, sulfonated polystyrenes, polyacrylamides, or the like. The hydrophilic layer may be 0.1 to 100 μm in thickness, preferably between 0.25 and 50 μm thick. In a preferred embodiment, the hydrophilic layer can be gelatin.

A propellant layer can be present on the support to force the colorant from the donor element to the receiving element. The propellant layer can include gas-producing polymers, for example, self-oxidizing binders, such as nitrocellulose, energetic polymers as described in U.S. Pat. No. 5,308,737 to Bills, et al., thermally decomposable polycarbonates as described in U.S. Pat. No. 5,156,938 to Foley, et al., and low ceiling temperature polymers as described in U.S. Pat. No. 5,576,144 to Pearce, et al.

The gas-producing polymer can include, for example, a vinyl polymer having recurring units containing a) one or more of a ketal group, an acetal group, a thioketal group, or a thioacetal group, or b) an unsaturated group containing a double or triple bond between any two atoms, one of which is the atom of attachment to the polymer chain, such as cyano, carbonyl, isocyanate, azide, sulfonyl, nitro, phosphoric, phosphonyl, acetylenic, ethylenic, substituted or unsubstituted aryl or heteroaryl. In one embodiment, the vinyl polymer can have repeating units derived from alkyl cyanoacrylates or amides, or methylene diacrylates or diamides. In another embodiment, the vinyl polymer is a poly(alkyl cyanoacrylate) such as poly(methyl cyanoacrylate), poly(ethyl cyanoacrylate), poly(propyl cyanoacrylate), poly(butyl cyanoacrylate), poly(ethylhexyl cyanoacrylate), or poly(methoxyethyl cyanoacrylate). The average molecular weights of the vinyl polymers can be between 1,000 and 1,000,000. Particularly good results have been obtained with polymers having a molecular weight between 2,000 and 500,000 weight average (polystyrene equivalent by size exclusion chromatography). The vinyl polymers can be copolymerized with other monomers. For example, the vinyl polymer can include copolymers of at least 50 wt. %, preferably more than 75 wt. % of repeating units as described above along with other vinyl monomers such as acrylates and methacrylates, acrylamides and methacrylamides, vinyl ethers, vinyl alkyl esters, maleic anhydrides, maleimides, itaconic acid and esters, fumaric acid and esters, etc.

Preferably, the absorbance of the propellant layer at the emission wavelength of the exposing laser is in the range of 0.45 to 1.0. The propellant layer may also contain small amounts of additives such as coating aids, anti-oxidants, color neutralizing dyes, UV stabilizers, and the like. The propellant layer may be coated from suitable solvents onto the support by any of the conventional techniques in the coating art, such as wire-wound rod, applicator roll, extrusion, curtain, etc., or may be printed thereon by a printing technique such as a gravure process. Preferably, the dry layer thickness is in the range of 0.1 to 1.0 μm.

Any dye or pigment can be used in the donor element, provided it is transferable to an image-receiving element by the action of energy. Especially good results have been obtained with sublimable dyes such as anthraquinone dyes, azo dyes, direct dyes, acid dyes, basic dyes, or any of the dyes described in U.S. Pat. Nos. 4,695,287, 4,743,582, 4,769,360, 4,853,366, 5,023,229, 5,079,213, and 5,081,101 to Evans, et al., U.S. Pat. No. 4,698,651 to Moore, et al., U.S. Pat. No. 4,701,439 to Weaver, et al., U.S. Pat. Nos. 4,753,922 and 4,757,046 to Byers, et al., U.S. Pat. Nos. 5,024,990, 5,041,412, 5,134,116, 5,792,587, 5,866,509, 5,874,196, 5,866,510, 6,221,807B1, 6,162,761, 6,127,316, 6,124,237, 6,124,239, 6,121,192, and 6,124,238 to Chapman, et al., U.S. Pat. No. 5,134,115 to Diehl, et al., U.S. Pat. No. 5,340,790 to Scaringe et al., U.S. Pat. Nos. 6,869,909B2 and 6,703,111 to Wang et al., U.S. Pat. No. 6,864,216B2 to Weidner et al., and U.S. Pat. No. 5,503,956 to Kaszczuk et al., for example. Suitable dyes may be employed singly or in combination. Suitable pigments can include transparent, opaque, and metallic pigments. Examples of suitable pigments include U.S. Pat. No. 6,190,827 to Weidner et al. and U.S. Pat. No. 6,899,988 to Kidnie et al. Pigments include organic and inorganic materials, such as metals, metal oxides, plastics, clay, and other additives that can act as colorants. Pigments can be used alone or in combination. One or more pigments can be combined with one or more dye within a donor layer to achieve a target color. A combination of pigment donors and dye donors can be used to form an image. Pigment donor elements that function according to a different mass transfer mechanism may also be suitable for the practice of the present invention. For example, it may be possible to employ a pigment donor element that operates by laser-induced film transfer ("LIFT").

In color proofing in the printing industry, it is important to be able to match the proofing ink references provided by the International Prepress Proofing Association. These ink references are density patches made with standard 4-color process inks and are known as SWOP (Specifications Web Offset Publications) Color References. For additional information on color measurement of inks for web offset proofing, see "Advances in Printing Science and Technology," Proceedings of the 19th International Conference of Printing Research Institutes, Eisenstadt, Austria, June 1987, J. T. Ling and R. Warner, p. 55. Some dyes and dye combinations found to match the SWOP Color References are the subject matter of U.S. Pat. Nos. 5,023,229, 5,024,990, and 5,081,101 to Chapman and Evans. It is also desirable to be able to match color references provided by other countries. In Europe, ISO 12647-2:1996(E) specifies standards for proofing and production printing on various paper substrates. In Japan, a different standard is used, referred to herein as Japan Color, established by the Japan National Committee for ISO/TC130. The donor elements described in U.S. Pat. Nos. 5,874,196 and 5,866,509 provide a good match for SWOP, European, and Japan Color values. U.S. Pat. No. 6,864,216 and U.S. Patent Publication US 2003/0226219 to Kaszczuk et al. provide further suitable donor elements.

The use of dyes in the donor layer of the donor element rather than pigments permits a wide selection of hue and color that enables a close match to a variety of printing inks and also permits easy transfer of images one or more times to an image-receiving element if needed. The use of dyes also allows easy modification of colorant density to any desired level. A combination of dyes is often desirable to provide a better color match to the printing inks used on-press, which often contain insoluble pigments as colorants. The use of pigments, however, can also closely match the pigments of the target color. The use of pigments provides an image with similar properties, such as metamerism, light fade, and gloss, to the target color. Both dyes and pigments have advantages and drawbacks, and both are suited for use in the donor elements described herein.

Individual colorants of the donor element can be used at a coverage of from 0.01 to 10 g/m². The total amount of dye in the donor element can be from 0.1 to 5 g/m², for example, from 0.5 to 2 g/m², and the total amount of pigments used in the donor element can be from 0.2 to 10 g/m² or more, or from 0.4 to 5 g/m². The colorants are generally dispersed in a polymeric binder, which can include monomeric or oligomeric resins as well. Suitable binders are known in the art, and are chosen based on the colorant. Suitable binders can include, for example, a cellulose derivative, for example, cellulose acetate hydrogen phthalate, cellulose acetate, cellulose acetate propionate, cellulose acetate butyrate, cellulose triacetate, or any of the materials described in U.S. Pat. No. 4,700,207 to Vanier, et al., or U.S. Pat. No. 5,256,622 to Henzel; a polycarbonate; polyvinyl acetate; poly(styrene-co-acrylonitrile); a poly(sulfone); a polyvinylacetal such as poly(vinyl alcohol-co-butyral); a poly(phenylene oxide); or other binders known in the art, such as those listed in U.S. Pat. Nos. 6,190,827 B1, 6,899,988 B2, and 6,855,474 B1. The binder may generally be used at a coverage of from 0.1 to 5 g/m², although more or less binder can be used as needed.

The colorant layer can include a colorant dispersed in a binder wherein at least 50%, preferably 75-90% by weight, of the binder is a monomeric or oligomeric resin and the balance is a polymeric resin. The optimal ratio of binder components depends on many factors, such as the exposure fluence and time, the rate of gas evolution within the propellant layer, the molecular weight of the polymeric component, and the $T_g$ or $T_m$, of the binder components. Suitable monomer resins useful in the colorant layer of the invention include hydrogenated and partially hydrogenated rosin esters and similar rosin derivatives. Commercially available materials include the glycerol ester of partially hydrogenated wood rosin, such as STAYBELITE™ Ester 10 (Hercules Inc.), the glycerol ester of hydrogenated rosin, such as FORAL™ 85 (Hercules Inc.) and the pentaerythritol ester of modified rosin, such as PENTALYN™ 344 (Hercules Inc.) Suitable oligomeric resins with a molecular weight of less than 4,000 useful in the colorant layer of the invention include polyesters, such as TONE™ P260 (Union Carbide Corp.), polyacrylates, polymethacrylates, alpha-methylstyrenes, polyethylene oxides, and the like. Suitable polymers useful in the colorant transfer layer of the invention preferably have a molecular weight between 15,000 and 50,000 and include polyacrylates, polymethacrylates, polyesters, polyvinylacetals, polyethylene-co-vinyl chloride, polycarbonates, etc. In a preferred embodiment of the invention, polyesters and polymethacrylates are employed. This binder can be useful where the colorant is a pigment.

The binder can include a hydroxylic polymer such as, for example, a cellulose, poly(vinyl alcohol), or polyvinyl butyral. The hydroxylic polymer can be cross-linkable. The hydroxylic polymer can be used alone or in combination with one or more other polymers, for example, a non-crosslinkable polymer. Suitable polymers for use with a hydroxylic polymer can include, but are not limited to, polyesters, polyamides, polycarbamates, polyolefins, polystyrenes, polyethers, polyvinyl ethers, polyvinyl esters, polyacrylates, and polymethacrylates. A hydroxylic-containing binder can be useful when the colorant is a pigment or metallic particle, for example, alumina, mica, or the like.

The colorant layer of the donor element may be coated on the support using conventional methods such as spin coating, rod coating, or sheet coating, or printed thereon by a printing technique such as a gravure process or ink jet printing. Other methods of forming the donor layer will be apparent to practitioners in the art. Preferably, the colorant layer has a thickness from 0.3 to 4.0 μm, although other thicknesses are acceptable. In one embodiment, the colorant transfer layer is 2.5 μm thick. The colorant layer can include a colorant stabilizer, for example, as described in U.S. Pat. No. 5,654,079, an optical brightener, or other additives as desired.

An optical brightener used in the colorant transfer layer may be, for example, a stilbene, benzotriazole, benzoxazole, coumarin, or pyrazoline. The optical brightener may be used in an amount of from 0.001 to 0.1 g/m², preferably from 0.002 to 0.05 g/m². The optical brightener can improve the whiteness of the transferred pigment. In the absence of the optical brightener, certain pigments, for example white, might absorb light in the far blue region of the visible spectrum, distorting the perceived color. For example, a white pigment without optical brightener can appear to have a slight cream tone.

An infrared-absorbing material may be used in the donor layer, an adjacent layer, or a combination thereof, in order to sensitize the donor element to infrared radiation. If the infrared-absorbing material is in a layer other than the donor layer, it can be in a layer adjacent the donor layer, between the donor layer and the support. As examples only, suitable infrared-absorbing materials can include cyanine infrared-absorbing dyes as described in U.S. Pat. No. 4,973,572, or other materials as described in the following U.S. Pat. Nos. 4,948,777; 4,950,640; 4,950,639; 4,948,776; 4,948,778; 4,942,141; 4,952,552; 5,019,480; 5,035,977; 5,034,303; 5,036,040; 6,124,075; and 4,912,083. A stabilizer can be added to the layer containing the infrared-absorbing material, as described, for example, in U.S. Pat. No. 6,261,739.

Suitable donor elements for use in the methods of the present invention are described, for example, in the above-listed patents of Eastman Kodak Company, Kodak Polychrome Graphics (a division of Eastman Kodak Company), Fuji Photo Film Co., Ltd., Minnesota Mining and Manufacturing Company, and James River Paper Company, Inc. Suitable donor elements are commercially available from Kodak Polychrome Graphics (Norwalk, Conn.), for example.

To form a spot varnish, a donor element including a transparent or opaque donor layer can be used. The donor element may be used to transfer a layer to the surface of an intermediate image-receiving element, or directly to the surface of a final image-receiving element such as a proof substrate. The transferred layer produces a surface or interface that provides a glossy appearance to the proof image in selected areas corresponding to the application of the transferred donor layer. Many donor elements can be used as a spot varnish donor.

Without wishing to be bound by theory, it is believed the spot-varnish effect results from the production of a smoother surface on the effected area of the image-receiving element as compared to the non-effected areas. The selected areas of the image-receiving element can have a 75 degree gloss level in the range from 10 to 90, for example, in the range from 40 to 80, from 60 to 80, or preferably from 70 to 80.

The selected areas of the image-receiving element can have a 75-degree gloss level that is higher than the gloss level similarly measured for non-selected areas. In general, the gloss level for selected areas can be at least 5 units higher than the gloss level for untreated areas, for example, 10 to 20 units higher, and often 30 units higher or more than the gloss level for non-selected areas of the image.

The donor layer of the spot varnish donor element can provide a sufficiently thick transferred layer to alter the gloss level of the selected area of the receiver as compared to either the non-imaged receiver or the non-selected areas of the imaged receiver. The transferred donor layer can have a total thickness of 1 µm or greater, for example, greater than or equal to 1.5 µm, greater than or equal to 2 µm, or greater than or equal to 3 µm. The desired total thickness can be achieved by printing more than one layer of donor, with or without any addenda, for example, colorant or other fillers.

The spot varnish donor layer can include a polymeric material, monomeric material, oligomeric material, or a combination thereof. Any of the materials listed herein suitable as binders for the colorant donor layer can be used as the spot varnish donor layer. The spot varnish donor layer can further include an optical brightener, a dye, or a pigment. The spot varnish color layer can be transparent or opaque. The spot varnish donor layer can simulate the color of the final imaged receiver (proof substrate), or of one or more image colors coincident on the imaged receiver with the spot varnish area. If more than one area on an imaged receiver is spot varnished, the spot varnish used to form each area can be the same or different in color as the spot varnish of at least one other area of the imaged receiver.

If the spot varnish is colored, the spot varnish donor element can be a colorant donor element as described herein. Any suitable dye or pigment as disclosed for use in a donor element can be used in the spot varnish donor element. The pigment generally takes the form of particles. Suitable pigments can include white pigments, IR absorbing transparent pigments, pigments matching another colorant layer of the same area, metallic pigments, and pigments matching the proof substrate.

In general, the transferred layer of spot varnish donor will provide a surface or interface that reflects in a directionally diffuse manner. In the final proof image, any transparent colorant that is present on the spot varnish area will affect the color of the imaged spot varnished area, but the gloss level of the imaged spot varnished area will be primarily dictated by the surface or interface provided by the spot varnish donor.

The spot varnish is preferably applied to the final image-receiving element before other colorant layers. The spot varnish donor layer can be applied directly to the final image-receiving element, or can be applied to an intermediate image-receiving element after all other colors have been imaged on the intermediate image-receiving element. However, where all colorant layers in the selected areas to be spot varnished are dyes, the spot varnish donor layer can be applied in any order with regard to the other image layers on an intermediate or final image-receiving element. It has been found that the dyes will migrate into the transferred spot varnish layer, making the order of application irrelevant. Where corresponding image areas to the spot varnish area contain one or more pigmented donor layers, the pigmented donor layers should be applied to the final image-receiving element on top of the spot varnish layer.

An example of a suitable spot varnish donor element is described in U.S. Pat. No. 6,190,827 to Weidner, et al., for example. U.S. Pat. No. 6,190,827 describes a laser donor element comprising a transparent support having thereon the following layers in the order recited: a) a hydrophilic layer; b) a propellant layer comprising a gas-producing polymer capable of forming a gas upon heating by the laser and an infrared-absorbing material; and c) a colorant transfer layer comprising a white pigment and an optical brightener dispersed in a binder. The colorant transfer layer can include any white pigment, such as, for example, titanium dioxide, zinc oxide, zinc sulfide, barium sulfate, or calcium carbonate. The pigment may be used in an amount of from 0.2 to 10 g/m$^2$, preferably from 0.4 to 5 g/m$^2$. Other suitable spot varnish donor elements include known colorant donor elements, and donor elements absent colorant, wherein only the binder is present in the donor layer.

The printing of the spot varnish layer, like the printing of any colorant layer, can be repeated two or more times. In the case of the spot varnish layer, printing two or more layers can increase the amount of gloss of the final image, however excessive printing of layers provides no added benefit. Typically, printing of one to four layers is sufficient. When a colorant layer is printed more than once, it can provide added density.

The image-receiving layer of the intermediate image-receiving element or the final image-receiving element, such as a proof substrate, onto which the image is printed can include, for example, a polycarbonate, a polyurethane, a polyester, poly(vinyl chloride), cellulose esters such as cellulose acetate butyrate or cellulose acetate propionate, poly(styrene-co-acrylonitrile), polycaprolactone, a poly(vinyl acetal) such as poly(vinyl alcohol-co-butyral), poly(vinyl alcohol-co-benzal), poly(vinyl alcohol-co-acetal), or mixtures thereof. The image-receiving layer may be present in any amount that is effective for the intended purpose. In general, good results have been obtained at a coverage of from 1 to 5 g/m$^2$, although it may be thinner or thicker as desired, for example, from 0.1 to 10 g/m$^2$.

An intermediate image-receiving element with subsequent transfer of an image from the intermediate image-receiving element to a second or final image-receiving element, such as a proof substrate, can be used. The image may be formed in reverse order on the intermediate-receiving element, such that the last color layer formed on the intermediate-receiving element is the first color layer applied to the final receiving element.

A typical intermediate image-receiving element comprises a support having thereon an image-receiving layer. The support may be a polymeric film such as a poly(ether sulfone), a polyimide, a cellulose ester such as cellulose acetate, a poly(vinyl alcohol-co-acetal), or a poly(ethylene terephthalate). The support thickness is not critical, but should provide adequate dimensional stability to support the transferred colorant layers. In general, polymeric film supports of from 5 to 500 µm thick can be used.

Because the proof substrate provides the desired background color for the proof image, the intermediate support need not provide any particular background color for viewing the image. After transfer of an image from the intermediate image-receiving element to the proof substrate, the intermediate support can be discarded. As such, an inexpensive, thin, support material can be used, for example, a simple clear support as described, for example, in U.S. Pat. No. 5,126,760 to DeBoer.

The intermediate image-receiving element support may be clear, opaque, and/or diffusely or specularly reflective. The support for the intermediate receiving element may be reflective such as baryta-coated paper, polyethylene-coated paper, an ivory paper, a condenser paper, or a synthetic paper such as DuPont™ TYVEK™ from Dupont, Wilmington, Del. Pigmented supports such as white polyester (transparent polyester with white pigment incorporated therein) may also be used.

Opaque (e.g. resin-coated paper) and reflective (e.g. metal-coated polymeric film) intermediate supports are preferred when a laser system is used to form an image on the image-receiving element. Preferably, the opaque layer is reflective, and most preferably specularly reflective. Suitable intermediate image-receiving elements are described in U.S. Pat. No. 5,278,576 to Kaszczuk, et al., for example.

The support can be a polymeric film such as, but not limited to, a poly(ether sulfone), a polyimide, a cellulose ester such as cellulose acetate, a poly(vinyl alcohol-co-acetal), or a poly(ethylene terephthalate). In general, polymeric film supports of from 5 to 500 µm thick can be used. Alternatively, a paper support can be used. Where a paper support is used, it is preferably resin coated to provide smoothness. The intermediate support thickness is not critical, but should provide adequate dimensional stability.

The intermediate image-receiving element can include a substantially opaque barrier layer. For the purposes of this invention, a layer is considered to be substantially opaque if it prevents a majority of the laser light used to heat the donor from passing through the intermediate receiving element. Such an opaque layer is preferably chosen to have an optical transmission density of at least 1.0, most preferably at least 1.4, at the wavelength of the laser light in order to minimize the fraction of the laser light that passes through the intermediate image-receiving element. This minimizes the amount of the laser light which can reach the printing drum surface or surfaces of other printing equipment where a drum is not used, and therefore minimizes any detrimental effect resulting from non-uniformity of reflectance of the laser off the printer surface.

The opaque layer used in the invention may comprise any material or combination of materials that prevents the majority of light at the wavelength of the laser light from passing through. Metallic layers such as aluminum, silver, nickel, titanium, etc., carbon layers, and pigmented polymeric layers such as titanium dioxide pigmented poly(ethylene terephthalate) or polyethylene, have been found to be effective for diode lasers operating in the near infrared region. Many other materials may also be used to form opaque layers, such as metal oxides, sulfides or salts, dyes, other colorants, etc., and selection of equivalent opaque layers is well within the skill of the artisan. The optimal thickness of the opaque layer depends upon the material of which it is made. For example, very thin metallic layers (e.g. on the order of 0.01 to 0.2 µm) provide sufficient optical density to prevent the majority of near infrared diode laser light from passing through, while thicker layers of pigmented polymers may be required to provide the same optical density. Optimization of the opaque layer thickness based upon the specific material used is a matter of routine experimentation and well within the skill of the artisan.

In a suitable embodiment of the invention, an opaque layer is used which is reflective to light at the wavelength of the laser used in the process of the invention. For the purposes of this invention, a layer is considered to be reflective when its total percent reflectance is greater than or equal to 15% measured at the wavelength of the laser light used to heat the dye donor. Such reflective layers have been found to result in an increase in the dye transfer efficiency to the intermediate image-receiving element compared to non-reflective opaque layers. In a more preferred embodiment, the opaque layer is highly reflective, having a total percent reflectance of greater than or equal to 50% at the wavelength of the laser light.

In a further preferred embodiment, the opaque layer can be primarily specularly reflective to light at the wavelength of the laser. A layer is considered to be primarily specularly reflective when it specularly reflects a greater percentage of light than it diffusely reflects. Vacuum deposited layers of metals such as chromium, copper, titanium, aluminum, silver, etc. and carbon are examples of primarily specularly reflective materials.

The intermediate image-receiving element may include a separate support bearing the opaque layer, or the opaque layer itself may function as the element support. Self-supporting opaque and/or reflective layers may take the form of films, foils, sheets, etc.

Where a separate support is used, the opaque layer may be applied by any conventional means such as solvent coating, vapor deposition, chemical vapor deposition, vacuum deposition, extrusion coating, lamination, etc. The opaque layer may be applied to the same side of the support as the image-receiving layer is to be applied to, or may be applied on the opposite side of the support. Preferably, when the opaque layer is also reflective, it is on the same side of the support as the image-receiving layer. This places the reflective layer closer to the donor layer, and thereby maximizes colorant transfer efficiency due to the laser being uniformly reflected back into the donor layer.

Spacer beads may be employed in the image-receiving layer of the intermediate image-receiving element in order to separate the colorant donor from the image-receiving element during colorant transfer, thereby increasing the uniformity and density of the transferred image. That feature is more fully described in U.S. Pat. No. 4,876,235 to DeBoer. Alternatively, spacer beads may be employed in a separate layer over the colorant transfer layer of the colorant donor element as described in U.S. Pat. No. 4,772,582 to DeBoer. The spacer beads may be coated as a separate layer with a polymeric binder on the colorant donor layer of the donor element or on the image-receiving layer of the intermediate image-receiving element if desired.

A release layer can be present between the support or barrier layer and the image-receiving layer of the intermediate image-receiving element in order to facilitate transfer of the imaged intermediate image-receiving layer to a final support. Any release layer as known in the art is suitable.

As an example, an intermediate support can include a support of polyethylene terephthalate (PET) having a thickness of 3.9 mil, an aluminum mirror layer which has an optical density in the range 3.5-4.0, a release layer comprising 96% polyester and 4% polycaprolactone plasticizer, and an image-receiving layer containing polyvinyl butyral as the polymer, having a thickness of 0.8 mil and containing spacer beads (19 µm average diameter) that protrude 8 µm from the surface.

As noted above, after an image is obtained on an intermediate image-receiving element, it can be transferred to a final image-receiving element, such as a proof substrate, in order to obtain a color proof. This can be accomplished, for example, by passing an assembly of the two image-receiving elements, image-receiving layer to image-receiving layer, between a pair of heated rollers. Other methods of retransferring the image could also be used such as using a heated platen, use of pressure, heat, or a combination thereof. Alternately, the image can be formed directly on the proof substrate from the donor elements.

In one embodiment, the proof substrate comprises paper or card stock. In another embodiment, a dye-migration barrier layer is applied to the proof substrate prior to transfer of the image. The dye-migration barrier layer is described further below.

Any proof substrate can be used to prepare the color proof. In many instances, it is desirable to employ the same substrate that is to be used for the printing press run which the proof substrate is emulating. The thickness of the proof substrate is not critical and may be chosen to best approximate the prints to be obtained in the actual printing press run. Examples of media which may be used as the proof substrate include, but are not limited to, the following: ADPROOF™ (Appleton Paper), FLO KOTE COVER™ (S. D. Warren Co.), QUINTESSENCE GLOSS™ and VINTAGE GLOSS™ (Potlatch Corporation, Cloquet, Minn.), KROMEKOTE™ (SMART Papers, Hamilton, Ohio), MONTEREY GLOSS™ (Tembec Paper Corporation, Montreal, Québec, Canada), CONSOLITH GLOSS™ (Consolidated Papers, Inc., Wisconsin Rapids, Wis.) and MOUNTIE MATT™ (Potlatch Corporation, San Francisco, Calif.). The proof substrate can be matte. The proof substrate can have a 75-degree gloss level of the unimaged substrate of 60 or less. A proof substrate wherein the gloss level of the unimaged substrate has a 75 degree gloss level of 60 or greater, for example, 70 or greater, or 75 or greater, is not desirable for formation of a spot varnish because the surface of the substrate is already very glossy, making visual distinction of the selected spot varnished area versus the non-selected areas difficult.

As described in U.S. Pat. No. 5,053,381 to Chapman, et al., a colorant-migration barrier layer (or "prelaminate") can optionally be applied to a proof substrate to prevent colorant smear and spreading. The colorant-migration barrier layer is generally applied (i.e., "prelaminated") to the proof substrate before an image is transferred from the intermediate image-receiving element to the proof substrate. U.S. Pat. No. 5,342,821 to Pearce also describes a suitable colorant-migration barrier layer.

The colorant-migration barrier layer may be any material that limits the tendency of the transferred colorant, for example, halftone image dots, from spreading due to migration into the proof substrate. Materials useful as colorant-migration barrier layers are those used as polymeric binders in the donor layer of the donor element described above and polymers used for the image-receiving layer of the intermediate image-receiving element. The colorant-migration barrier layer is preferably thin so as to not affect the appearance of the final color image, while still thick enough to provide adequate protection against migration of the colorant image into the proof substrate. In general, coverages of from 0.1 to 5 $g/m^2$ are preferred for polymeric colorant-migration barrier layers. The colorant-migration barrier layer may be applied to the proof substrate by any conventional method such as but not limited to extrusion coating, solvent coating, or lamination.

In a preferred method of application, the colorant-migration barrier layer is a polymeric layer preformed on a support, which is then laminated to the proof substrate. The support can then be separated from the colorant-migration barrier layer. This layer application can be accomplished, for example, by passing the proof substrate and the polymeric colorant-migration barrier layer with support between a pair of heated rollers to form a laminate, and then stripping the support away. Other methods of transferring the colorant-migration barrier layer from its support to the final image-receiving substrate (e.g., proof substrate) could also be used such as using a heated platen, using a resistive thermal head, other conventional use of pressure and/or heat, external heating, or the like. To facilitate separation, release agents may be included within or between the colorant-migration barrier layer and its support. For example, conventional silicone based materials or hydrophilic cellulosic materials may be used. Useful supports for a colorant-migration barrier layer include those listed above for the intermediate image-receiving element.

A process suitable for obtaining a color image with the colorant donor elements described above has been generally described in U.S. Pat. No. 5,126,760, and is conveniently carried out using a commercially available laser thermal proofing system such as, for example, the Kodak APPROVAL™ system or the Creo TRENDSETTER SPECTRUM™ system, both from Eastman Kodak Company, Rochester, N.Y. Typically, an intermediate image-receiving element is placed on a rotating drum. Individual colorant donor elements (such as cyan, magenta, yellow and black) are successively placed in assembly with the intermediate image-receiving element and imaged. An image for each color can be transferred by imagewise exposure through the backside of the donor element using an infrared laser beam, for instance. Thus, in the practice of the invention, a colorant image may be transferred by imagewise heating a donor element containing an infrared-absorbing material with a diode laser to volatilize or expel the colorant, the diode laser beam being modulated by a set of signals which is representative of the shape and color of the original image, so that the colorant is heated to cause volatilization or expulsion only in those areas in which its presence is required on the intermediate image-receiving element or final proof substrate to reconstruct the original image.

As noted above, in making a color proof, a set of electrical signals is generated which is representative of the shape and color of an original image. Data useful for the re-creation of such electrical signals can be stored digitally. Data can be generated, for example, by scanning an original image, filtering the image to separate it into the desired additive primary, secondary, and tertiary colors, and then converting the light energy into electrical energy. The electrical signals are then modified by computer to form the color separation data that are used to form a halftone color proof. Instead of scanning an original object to obtain the electrical signals, the signals may also be generated by computer. This process is described more fully in Graphic Arts Manual, Janet Field ed., Arno Press, New York 1980 (p. 358ff), the disclosure of which is hereby incorporated by reference. Data corresponding to the desired spot varnish can be generated simultaneously with the colorant layer data from the original image, or separately where it is determined to add a spot varnish to enhance a portion of the original image. The data corresponding to the spot varnish layer or layers necessary for a particular image can be transferred with the other image-forming data to the proofing equipment for formation of the spot-varnished proof.

As noted above, a laser can be used to transfer colorant (i.e., dye or pigment) from the colorant donor elements used in the invention. It is preferred to use a diode laser since it offers substantial advantages in terms of its small size, low cost, stability, reliability, ruggedness, and ease of modulation. In practice, before any laser can be used to heat a donor element, the element must contain an absorbing material, such as an infrared absorber, which absorbs at the emitting wavelength of the laser.

Lasers that can be used to transfer dye or pigment from donors employed in the invention are available commercially. There can be employed, for example, Laser Model SDL-2420-H2 from Spectra Diode Labs, or Laser Model SLD 304 V/W from Sony Corp.

U.S. Pat. No. 4,876,235 to DeBoer reports a dye-receiving element comprising a support including spacer beads to prevent contact between the donor element and image-receiving element during transfer of an image. U.S. Pat. No. 5,017,547 to DeBoer reports the use of a vacuum applied to an assembly of a donor and a receptor during imaging, to reduce the space between the donor and image-receiving elements in order to minimize the mean free path the vaporized dye molecules travel without collision with other molecules. Either or both enhancements may be employed in the practice of the invention.

After formation, the image on the intermediate image-receiving element may be subsequently transferred to a final image-receiving element (such as a color proof substrate, optionally including a dye-migration barrier layer), for example, by passing an assembly of the intermediate and final image-receiving elements between two heated rollers, use of a heated platen, use of a resistive thermal head, use of other forms of pressure and/or heat, external heating, etc. The support from the intermediate image-receiving element is separated from the final image-receiving element (e.g., the proof substrate) after the image is transferred to the element. Release agents may be included between or within the support and image-receiving layer of the intermediate image-receiving element to facilitate separation. After transfer of an image from the intermediate image-receiving element to the proof substrate, the intermediate support may be discarded.

In the practice of the present invention, a spot-varnish finish is simulated by including a gloss-providing layer under an image comprised of transparent colorants on the final receiver. In one embodiment, the invention includes a method comprising the steps of: a) providing an intermediate image-receiving element having an image-receiving surface; b) applying a colorant such as a transparent dye to at least a selected area of the image-receiving surface; c) applying a spot varnish layer, such as an opaque pigment-containing layer, over the transparent dye in the selected area; d) contacting the imaged image-receiving surface of the intermediate element to an opaque proof substrate to form an assembly; e) transferring the colorant layers from the selected areas of the intermediate receiver to the proof substrate by the action of heat or pressure or both on the assembly; and f) separating the support of the intermediate image-receiving element from the proof substrate. As a result of the method, the area on the proof substrate corresponding to the selected area has a higher gloss level than areas for which only one or more colorant and no spot varnish layer is present on the proof substrate.

In a variation of the above-described method, a spot varnish layer can be applied directly to a proof substrate in an area that corresponds to the selected area. The remaining colorant layers can then be applied directly on top of the spot varnish layer from a donor, or can be transferred onto the spot varnish layer on the proof substrate through an intermediate image-receiving element.

A spot varnish donor element may be used to transfer a layer containing an optional colorant and binder to the surface of an intermediate image-receiving element, or directly to the surface of a proof substrate. In one embodiment, the layer of optional colorant and binder produces a surface or interface that provides a glossy appearance to the proof image in the selected areas. In another embodiment, the colorant of the spot varnish donor layer is chosen to closely match the color of the proof substrate. In yet another embodiment, the color of the spot varnish donor layer is chosen to closely match the color of the overlying proof image.

In embodiments of the invention where a spot varnish donor layer is transferred by digital halftone imaging, it may be desirable to image the spot varnish donor layer at 100% (i.e., as a solid region with no halftone pattern) in the selected areas. Hence, it may be desirable to utilize a mass-transfer mechanism so that the spot varnish donor layer is transferred as a distinct layer through the processing steps.

In another embodiment of the invention, the proof image can include any transparent colorant. In yet another embodiment, a gloss-providing layer can be applied to a proof substrate or to the image-receiving surface of the intermediate image-receiving element. A gloss-providing layer is a layer that provides a surface or interface that reflects in a directional diffuse manner and otherwise satisfies the objectives of the present invention.

The methods of the invention are further illustrated by the following non-limiting examples.

EXAMPLES

Example 1

Four-Color Proof on Paper—White Spot Varnish

A proof requiring four process colors, cyan (C), magenta (M), yellow (Y), and black (K) was prepared using a KODAK APPROVAL NX™ Digital Color Proofing System preloaded with the appropriate four donor elements and intermediate image-receiving element, all available from Kodak Polychrome Graphics (Norwalk, Conn.) or Eastman Kodak Company (Rochester, N.Y.). The black dye donor (DK02; #3879) was contacted with the intermediate image-receiving element (#1834) and imaged according to information stored in a digital file, causing transfer of black dye to the intermediate image-receiving element in the image areas. Cyan (DC02; #1825), magenta (DM02; #1872), and yellow (DY01; #1831) dye donors were respectively imaged in a similar fashion, in the order stated.

Next, a white pigment donor element (DW01; #1670) was contacted with the intermediate image-receiving element. The white pigment donor element was imaged according to information stored in a digital file as a solid area (i.e., 100%, with no halftone pattern) only in areas in which a simulated spot-varnish finish was desired, causing transfer of white pigment and binder to the intermediate image-receiving element in the selected areas. A second layer of white pigment and binder (a "second pass") was applied similarly in the selected areas.

The imaged intermediate image-receiving element was contacted with a proof substrate, which was a white paper stock, Opus™ Dull Cover available from Sappi Fine Paper North America (Boston, Mass.). The proof substrate had been prelaminated with Kodak Approval Digital Color Proofing Film P02 Prelaminate. The intermediate image-receiving element and proof substrate were passed through a Kodak 800XL Laminator (Temperature: high; Speed: high or 50 which is approximately 27"/minute), with the image-bearing side of the intermediate image-receiving element in contact with the prelaminate layer on the proof substrate. The image was transferred from the intermediate image-receiving element to the proof substrate under action of heat and pressure.

The resulting proof image consisted mainly of matte image areas, with a higher level of glossiness in the selected areas to which the white pigment and binder had been applied. The selected areas exhibited the color of the dye image, and the color was not significantly changed by the presence of the binder and pigment. The glossy areas of the proof image provided an excellent match for an on-press spot varnish.

Example 2

Four-Color Proof on Metallized Stock—White Spot Varnish

A proof requiring four process colors, cyan (C), magenta (M), yellow (Y), and black (K) was prepared using a KODAK APPROVAL NX™ Digital Color Proofing System preloaded with the appropriate donor elements and intermediate image-receiving element, all available from Kodak Polychrome Graphics or Eastman Kodak Company. The black dye donor (DK03; #2760) was contacted with the intermediate image-receiving element (#1834) and imaged according to information stored in a digital file, causing transfer of black dye to the intermediate image-receiving element in the image areas. Cyan (DC02; #1825), magenta (DM02; #1872), and yellow (DY01; #1831) dye donors were respectively imaged in a similar fashion, in the order stated.

Next, a white pigment donor element (DW01; #1670) was contacted with the intermediate image-receiving element. The white pigment donor element was imaged according to information stored in a digital file as a solid area (i.e., 100%, with no halftone pattern) only in areas in which a simulated spot-varnish finish was desired, causing transfer of white pigment and binder to the intermediate image-receiving element in the selected areas. A second layer of white pigment and binder (a "second pass") was applied similarly in the selected areas.

The intermediate image-receiving element was contacted with a proof substrate, which was a metallized board stock. The proof substrate had been prelaminated with Kodak Approval Digital Color Proofing Film P02 Prelaminate. The intermediate image-receiving element and proof substrate were passed through a Kodak 800XL Laminator (Temperature: high; Speed: high or 50 which is approximately 27"/minute), with the image-bearing side of the intermediate image-receiving element in contact with the prelaminate layer on the proof substrate. The image was transferred from the intermediate image-receiving element to the proof substrate under action of heat and pressure.

The resulting proof image consisted mainly of matte image areas, with a higher level of glossiness in the selected areas to which the white pigment and binder had been applied. The selected areas exhibited the color of the dye image, and the color was not significantly changed by the presence of the binder and pigment. The glossy areas of the proof image provided an excellent match for an on-press spot varnish.

Example 3

Four-Color Proof on Paper—Colored Spot Varnish

A proof requiring four process colors, cyan (C), magenta (M), yellow (Y), and black (K) was prepared using a KODAK APPROVAL NX™ Digital Color Proofing System preloaded with the appropriate four donor elements and intermediate image-receiving element, all available from Kodak Polychrome Graphics (Norwalk, Conn.) or Eastman Kodak Company (Rochester, N.Y.). The black dye donor (DK03; #3547) was contacted with the intermediate image-receiving element (#1834) and imaged according to information stored in a digital file, causing transfer of black dye to the intermediate image-receiving element in the image areas. Cyan (DC03; #9289), magenta (DM03; #3951), and yellow (DY03; #9086) dye donors were respectively imaged in a similar fashion, in the order stated.

Next, a gold-colored pigment donor element, Matchprint Negative Proofing Film Mt. Gold, was contacted with the intermediate image-receiving element. The gold-colored pigment donor element was imaged according to information stored in a digital file as a solid area (i.e., 100%, with no halftone pattern) only in areas in which a simulated spot-varnish finish was desired, causing transfer of gold pigment and binder to the intermediate image-receiving element in the selected areas. Nine more layers of gold pigment and binder were applied in the selected areas, for a total of ten layers of gold pigment and binder.

The imaged intermediate image-receiving element was contacted with a proof substrate, which was a white paper stock, Centura Gloss Text 100#, available from Stora Enso Papers, NY, N.Y. The proof substrate had been prelaminated with Kodak Approval Digital Color Proofing Film P02 Prelaminate. The intermediate image-receiving element and proof substrate were passed through a Kodak 800XL Laminator as described in Examples 1 and 2, with the image-bearing side of the intermediate image-receiving element in contact with the prelaminate layer on the proof substrate. The image was transferred from the intermediate image-receiving element to the proof substrate under action of heat and pressure.

The resulting proof image consisted mainly of matte image areas, with a slightly higher level of glossiness in the selected areas to which the gold pigment and binder had been applied as a spot varnish.

Example 4

Four-Color Proof on Paper—Colored Spot Varnish

A proof requiring four process colors, cyan (C), magenta (M), yellow (Y), and black (K) was prepared as described in Example 3. Next, a metallic donor element (DS01; #1766) was contacted with the intermediate image-receiving element. The metallic donor element was imaged according to information stored in a digital file as a solid area (i.e., 100%, with no halftone pattern) only in areas in which a simulated spot-varnish finish was desired, causing transfer of metallic pigment and binder to the intermediate image-receiving element in the selected areas. Five more layers of metallic pigment and binder were applied in the selected areas for a total of six layers of metallic pigment and binder.

The imaged intermediate image-receiving element was contacted with a proof substrate as described in Example 3, except the proof substrate was Carolina C1S low density blank 24t pt paper from International Paper (Memphis, Tenn.). The resulting proof image consisted mainly of matte image areas, with a higher level of glossiness in the selected areas to which the metallic pigment and binder had been applied as a spot varnish.

Example 5

Gloss Level Measurements on Paper

Test proofs 1-3 were made according to the techniques used in corresponding Examples 1, 3, and 4, respectively. For each proof corresponding to one of Examples 1, 3, and 4, the colored image areas consisted of squares of 100%, 75%, 50%, and 20% of each of the following colors: black, cyan, magenta, yellow, red, green, blue, and spot color Pantone 354, wherein red, green and blue are formed from a combination of cyan, magenta, and yellow. The spot donors were applied as follows. For test proof 1, varying numbers of passes of white pigment spot varnish donor, from zero to four passes, were used at 100% on a portion of each color square. For test proof 2, the gold pigment spot varnish donor was written with ten passes at 100% solid on a portion of each color square. For test proof 3, the metallic spot varnish donor was written with six passes at 100% solid on a portion of each color square.

Gloss level readings were taken using a QIP GLOSS-MATE™ 75° (factory-set single angle geometry) from Quality Imaging Products (Marietta, Ga.). The method of measurement conforms to standard ISO 8254-1.

All color squares of a given test proof exhibited approximately the same gloss level, essentially independent of color. Typical readings are given in Table 1 below, wherein test proof 1 (white spot varnish) corresponds to Condition I, test proof 2 (gold spot varnish) corresponds to Condition IV, and test proof 3 (metallic spot varnish) corresponds to Condition V. For the control measurement for each test proof (0 passes of the pigment donor element), the proof image corresponds to what would be obtained using a typical proofing procedure.

The data provided in the table below demonstrates that the practice of the present invention significantly enhances the gloss level of the areas to which the pigment and binder layer had been applied, relative to the control, regardless of the type of pigment. As can be seen from the examples, the gloss level can be enhanced when two or more layers of pigment and binder are used, as compared to only one layer. The results of the gloss layer are dependent on the thickness of the transferred spot varnish donor layer. The white layer is thicker than the metallic layer, which in turn is thicker than the gold layer. Higher gloss levels can be achieved with the addition of further layers of spot varnish donor, though as demonstrated with the white spot varnish donor, after a certain number of layers, dependent on the type of donor used, additional layers may provide only minimal improvements in gloss.

Also given in the table is data corresponding to a sample having only a white pigment and binder layer (i.e., no dye image) over a prelaminated substrate (Condition II), and a sample having only a white pigment and binder layer (i.e., no dye image or prelaminate) over a substrate (Condition III). The measured gloss level was essentially the same for both conditions, and was also essentially the same as for Condition I (dye image over white pigment layer on prelaminated substrate). The data indicate that the degree of gloss obtained by the method of the invention is independent of the dye image, and of the prelaminate.

GLOSS LEVEL MEASUREMENTS
FOR VARIOUS CONDITIONS

| | Condition | Number of passes with white pigment donor | | | | | |
|---|---|---|---|---|---|---|---|
| | | 1 | 2 | 4 | 6 | 10 | 0 (Control) |
| I. | Dye image over white pigment layer on prelaminated substrate | 59 | 70 | 72 | | | 42 |
| II. | White pigment layer only (i.e., no dye image) over prelaminated substrate | | 71 | | | | |
| III. | White pigment layer only (i.e., no dye image or prelaminate) over substrate | | 72 | | | | |
| IV. | Dye image over gold pigment layer on prelaminated substrate | | | | | 58 | 50 |
| V. | Dye image over metallic layer on prelaminated substrate | | | | 69 | | 54 |

Example 6

Gloss Level Measurements on Paper—Transparent Spot Varnish

A further experiment was done wherein an acrylic latex layer from a Matchprint Digital Halftone GT Prep Sheet, catalog #0724399, was laminated to a receiver of Stora Enso CENTURA™ Gloss Cover #100. No pigment or dye image was transferred to the substrate. The gloss level was measured as indicated in the previous Examples, at an angle of 75 degrees. The substrate alone provided a gloss level of 53, while the laminated substrate provided a gloss level of about 74. When an image was printed over the laminated area of the substrate, no color shift as compared to non-laminated printed areas of the substrate was seen. This indicates a transparent polymeric coating can be used as a spot varnish.

This invention may take on various modifications and alterations without departing from the spirit and scope thereof. Accordingly, it is to be understood that this invention is not to be limited to the above description, but it is to be controlled by the limitations set forth in the following claims and any equivalents thereof. It is also to be understood that this invention may be suitably practiced in the presence or absence of any element not specifically disclosed herein.

In describing preferred embodiments of the invention, specific terminology is used for the sake of clarity. The invention, however, is not intended to be limited to the specific terms so selected, and it is to be understood that each term so selected includes all technical equivalents that operate similarly.

The invention claimed is:

1. A method for making a color proof having at least one selected image area with a spot-varnish finish, the method comprising:
    imagewise applying a spot-varnish to a proof substrate in the selected image area, wherein said spot-varnish is transparent or the color of said proof substrate; and
    imagewise applying colorant to the spot-varnished proof substrate to form the color proof, whereby the at least one selected image area on the final color proof image has a higher gloss level than non-selected areas having no spot-varnish and wherein said spot-varnish is located between said proof substrate and said colorant in said final color proof, and wherein imagewise applying colorant to the spot-varnished proof substrate comprises imagewise applying one or more colorants to an intermediate image-receiving substrate, and transferring the one or more imaged colorants from the intermediate substrate to the spot-varnished proof substrate.

2. The method of claim 1, wherein the step of imagewise applying a colorant comprises imagewise exposing a colorant donor element with an infrared laser.

3. The method of claim 1, wherein the spot-varnish provides a surface or interface that reflects light in a directionally diffuse manner.

4. The method of embodiment 1, wherein the step of imagewise applying the spot varnish comprises imagewise exposing a spot varnish donor element with an infrared laser.

5. The method of claim 1, wherein the spot varnish comprises an opaque pigment, a metallic pigment, a monomeric material, an oligomeric material, a polymeric material, or a combination thereof.

6. A method of forming a color proof, compnsing:
analyzing an image to create data representative of each image color and each image glossy area;
transmitting the data to a proof printer;
imagewise printing each image color and a spot varnish corresponding to each glossy area to a receiving substrate with the proof printer to from a final proof image, wherein said spot-varnish is transparent or the color of said receiving substrate, and wherein said spot-varnish is located between said receiving substrate and said colorant in said color proof, wherein the receiving substrate is an intermediate receiver, and each image color is applied to the intermediate receiver before the spot varnish is applied to the intermediate receiver and wherein the method further comprises transferring the imaged spot varnish and color from the intermediate receiver to a proof substrate to form the final color proof image.

7. The method of claim 1, wherein said color proof is a digital color proof.

8. The method of claim 1, wherein said color of said proof substrate is white.

9. The method of claim 1, wherein said imagewise applying a spot-varnish to a proof substrate in the selected image area printing of the spot varnish layer is repeated two or more times.

10. The method of claim 6, wherein the step of imagewise applying a colorant comprises imagewise exposing a colorant donor element with an infrared laser.

11. The method of claim 6, wherein the spot-varnish provides a surface or interface that reflects light in a directionally diffuse manner.

12. The method of embodiment 6, wherein the step of imagewise applying the spot varnish comprises imagewise exposing a spot varnish donor element with an infrared laser.

13. The method of claim 6, wherein the spot varnish comprises an opaque pigment, a metallic pigment, a monomeric material, an oligomeric material, a polymeric material, or a combination thereof.

14. The method of claim 6, wherein said color proof is a digital color proof.

15. The method of claim 6, wherein said color of said proof substrate is white.

16. The method of claim 6, wherein said imagewise applying a spot-varnish to a proof substrate in the selected image area printing of the spot varnish layer is repeated two or more times.

17. A method for making a color proof having at least one selected image area with a spot-varnish finish, the method comprising:
imagewise applying a spot-varnish to a proof substrate in the selected image area, wherein said spot-varnish is transparent or the color of said proof substrate; and
imagewise applying colorant to the spot-varnished proof substrate to form the color proof,
whereby the at least one selected image area on the final color proof image has a higher gloss level than non-selected areas having no spot-varnish and wherein said spot-varnish is located between said proof substrate and said colorant in said final color proof,
wherein imagewise applying spot-varnish to a proof substrate in the selected image area comprises imagewise applying the spot-varnish to an intermediate image-receiving substrate, and transferring the imaged spot varnish from the intermediate substrate to the proof substrate.

18. The method of claim 17, wherein the step of imagewise applying a colorant comprises imagewise exposing a colorant donor element with an infrared laser.

19. The method of claim 17, wherein the spot-varnish provides a surface or interface that reflects light in a directionally diffuse manner.

20. The method of embodiment 17, wherein the step of imagewise applying the spot varnish comprises imagewise exposing a spot varnish donor element with an infrared laser.

21. The method of claim 17, wherein the spot varnish comprises an opaque pigment, a metallic pigment, a monomeric material, an oligomeric material, a polymeric material, or a combination thereof.

22. The method of claim 17, wherein said color proof is a digital color proof.

23. The method of claim 17, wherein said color of said proof substrate is white.

24. The method of claim 17, wherein said imagewise applying a spot-varnish to a proof substrate in the selected image area printing of the spot varnish layer is repeated two or more times.

25. A method for making a color proof having at least one selected image area with a spot-varnish finish, the method comprising:
imagewise applying a spot-varnish to a proof substrate in the selected image area, wherein said spot-varnish is transparent or the color of said proof substrate; and
imagewise applying colorant to the spot-varnished proof substrate to form the color proof,
whereby the at least one selected image area on the final color proof image has a higher gloss level than non-selected areas having no spot-varnish and wherein said spot-varnish is located between said proof substrate and said colorant in said final color proof, wherein the steps of imagewise applying spot-varnish to a proof substrate in the selected image area and imagewise applying colorant to the spot-varnished proof substrate to form the final color proof image comprise:
imagewise applying one or more colorants to an intermediate image-receiving substrate;
imagewise applying the spot-varnish to the colorant imaged intermediate image-receiving substrate;

superposing the imaged side of the image-receiving substrate with an image-receiving side of the proof substrate to form an assembly;

transferring the imagewise spot varnish and one or more colorants from the intermediate image-receiving substrate to the proof substrate such that the spot varnish is applied to the proof substrate before the one or more colorants, forming the final color proof image; and separating the intermediate image-receiving substrate from the color proof.

26. The method of claim 25, wherein the step of imagewise applying a colorant comprises imagewise exposing a colorant donor element with an infrared laser.

27. The method of claim 25, wherein the spot-varnish provides a surface or interface that reflects light in a directionally diffuse manner.

28. The method of embodiment 25, wherein the step of imagewise applying the spot varnish comprises imagewise exposing a spot varnish donor element with an infrared laser.

29. The method of claim 25, wherein the spot varnish comprises an opaque pigment, a metallic pigment, a monomeric material, an oligomeric material, a polymeric material, or a combination thereof.

30. The method of claim 25, wherein said color proof is a digital color proof.

31. The method of claim 25, wherein said color of said proof substrate is white.

32. The method of claim 25, wherein said imagewise applying a spot-varnish to a proof substrate in the selected image area printing of the spot varnish layer is repeated two or more times.

33. A method of forming a color proof, comprising:

analyzing an image to create data representative of each image color and each image glossy area;

transmitting the data to a proof printer; and imagewise printing each image color and a spot varnish corresponding to each glossy area to a receiving substrate with the proof printer to form a final proof image, wherein said spot-varnish is transparent or the color of said receiving substrate, and wherein said spot-varnish is located between said receiving substrate and said colorant in said color proof, wherein the receiving substrate is a proof substrate, and wherein the spot varnish is applied to the proof substrate before each image color is applied to the proof substrate, wherein each image color is first applied to an intermediate receiver, and then transferred to the proof substrate having the spot varnish.

34. The method of claim 33, wherein the step of imagewise applying a colorant comprises imagewise exposing a colorant donor element with an infrared laser.

35. The method of claim 33, wherein the spot-varnish provides a surface or interface that reflects light in a directionally diffuse manner.

36. The method of embodiment 33, wherein the step of imagewise applying the spot varnish comprises imagewise exposing a spot varnish donor element with an infrared laser.

37. The method of claim 33, wherein the spot varnish comprises an opaque pigment, a metallic pigment, a monomeric material, an oligomeric material, a polymeric material, or a combination thereof.

38. The method of claim 33, wherein said color proof is a digital color proof.

39. The method of claim 33, wherein said color of said proof substrate is white.

40. The method of claim 33, wherein said imagewise applying a spot-varnish to a proof substrate in the selected image area printing of the spot varnish layer is repeated two or more times.

* * * * *

UNITED STATES PATENT AND TRADEMARK OFFICE
CERTIFICATE OF CORRECTION

| | | |
|---|---|---|
| PATENT NO. | : 7,294,445 B2 | Page 1 of 1 |
| APPLICATION NO. | : 11/240721 | |
| DATED | : November 13, 2007 | |
| INVENTOR(S) | : Eileen T. Henry et al. | |

It is certified that error appears in the above-identified patent and that said Letters Patent is hereby corrected as shown below:

Column 23, Line 25    In Claim 6, delete "compnsing:" and insert -- comprising: --
Column 23, Line 32    In Claim 6, delete "from" and insert -- form --

Signed and Sealed this

Sixth Day of May, 2008

JON W. DUDAS
*Director of the United States Patent and Trademark Office*